United States Patent [19]

Marchio' et al.

[11] Patent Number: 4,916,378
[45] Date of Patent: Apr. 10, 1990

[54] INDUCTIVE LOAD DISCHARGE CURRENT RECIRCULATION CIRCUIT WITH SELECTABLE "FAST" AND "LOW" MODES

[75] Inventors: Fabio Marchio', Gallarate; Marco Morelli, Leghorn; Francesco Tricoli, Milan, all of Italy

[73] Assignee: SGS-Thomson Microelectronics s.r.l., Brianza, Italy

[21] Appl. No.: 380,220

[22] Filed: Jul. 14, 1989

[30] Foreign Application Priority Data

Jul. 20, 1988 [IT] Italy ................................ 83649 A/88

[51] Int. Cl.$^4$ ................................................ G05F 1/56
[52] U.S. Cl. ...................................... 323/222; 323/282; 323/351
[58] Field of Search ............... 323/222, 282, 284, 285, 323/349, 351

[56] References Cited

U.S. PATENT DOCUMENTS

| | | | |
|---|---|---|---|
| 3,525,924 | 8/1970 | Atterholt | 33/282 |
| 3,809,998 | 5/1974 | Mansson | 323/282 |
| 4,598,244 | 7/1986 | Majima et al. | 323/351 |
| 4,658,203 | 4/1987 | Freymuth | 323/282 |
| 4,691,271 | 9/1987 | Rosenbaum et al. | 323/222 |
| 4,733,159 | 3/1988 | Edwards et al. | 323/282 |

Primary Examiner—Peter S. Wong
Attorney, Agent, or Firm—Bierman and Muserlian

[57] ABSTRACT

A circuit for recirculating the discharge current of an inductive load driven from the high side of the supply at two different recirculation voltages which may be selected for implementing a slow or a fast recirculation of the current advantageously employs a single power element represented by an NPN transistor functionally connected in parallel to the load. During a driving phase of the load a slow recirculation of the discharge current is implemented by delivering to the base of the recirculation NPN transistor a current sufficient to keep it saturated. upon switching off the load, when a fast recirculation of the dischage current through the recirculation NPN transistor is desired, delivery of the saturating current to the base of the recirculation transistor is interrupted and the transistor remains conducting having a diode and a zener diode in opposition thereto connected in series between ground and the base of the recirculation NPN transistor for permitting the recirculation at a voltage substantially equal to the sum of the voltage drop through the first diode, the zener voltage and the base-emitter voltage of the recirculation NPN transistor.

2 Claims, 1 Drawing Sheet

INDUCTIVE LOAD DISCHARGE CURRENT RECIRCULATION CIRCUIT WITH SELECTABLE "FAST" AND "LOW" MODES

BACKGROUND OF THE INVENTION

1. Field of the Invention

The present invention relates to switching mode electronic drive circuits for inductive loads and, in particular, to monolithically integrated circuits of this type.

2. Description of the Prior Art

When driving inductive loads, e.g. electric motors, in a switching mode, the necessity of providing suitable circuit means for recirculating the discharge current of the energy stored in the inductance following each current interruption is well known. This in order to limit the overvoltage (negative in the case of an inductive load driven from the high side of the supply and therefore with a terminal connected to ground) across the load due to the discharge of the energy stored in the inductance during the preceding charging stage, i.e. at the beginning of the current flow through the load. These negative voltage peaks (below ground) if not properly controlled in intensity, may cause the breakdown of junctions and, in case of integrated circuits, the triggering of parasitic transistors and of problems deriving therefrom.

There are many peculiar applications wherein the inductive load, e.g. an electric motor, must be frequently stopped in order to change speed of rotation, commonly by having another cooperating motor taking over. In a situation of this type it is necessary to provide means for a "slow" recirculation of the discharge current during the switching mode driving of the motor, as well as means, selectable through a switch whenever the action of the motor must be completely interrupted, capable of permitting a "fast" recirculation of the discharge current of the load. Essentially the slow recirculation means discharge the inductance at a relatively limited negative voltage (below ground voltage) while the fast recirculation means permit the discharge of the energy stored in the inductance at a relatively higher negative voltage (below ground voltage) for speeding up the discharge process.

In these instances, the commonly used circuit according to the prior art is depicted in FIG. 1. The load L driving transistor (high side driver) is the transistor Td, which is base-driven by a driving signal Vin. A fast recirculation of the inductance L discharge current, when the current flowing through the load must estinguish quickly, occurs through the recirculation path formed by the zener diode Dz and by the diode D. When a slow recirculation is desired, e.g. for maintaining a certain "continuity" of current flow through the load, the zener diode Dz is shortcircuited by means of a switch S driven by an arresting signal of the electrical supply of the inductive load L. This known solution requires three power devices, namely the diode D and the zener Dz, both capable of recirculating the discharge current of the inductive load, as well as a switch S also capable of withstanding the same recirculation current. This implies a large area requirement.

SUMMARY OF THE INVENTION

The invention provides a circuit for recirculating the discharge current of an inductive load which may be alternatively set for implementing a slow recirculation or a fast recirculation of the current and which employs a single power device for the recirculation.

DESCRIPTION OF THE PREFERRED EMBODIMENT

Figure 1:
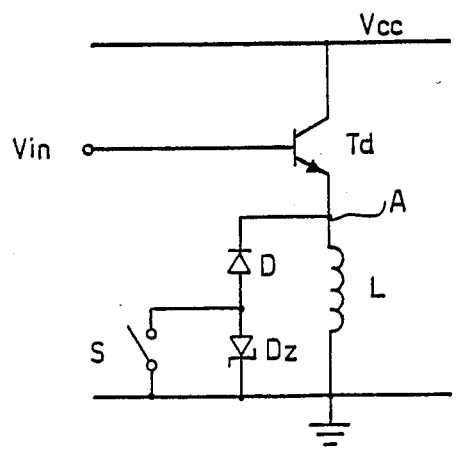
FIG. 1 shows a circuit for recirculating the discharge current of an inductive load which may be optionally set for a slow recirculation or for a fast recirculation according to a known technique.
Figure 2:
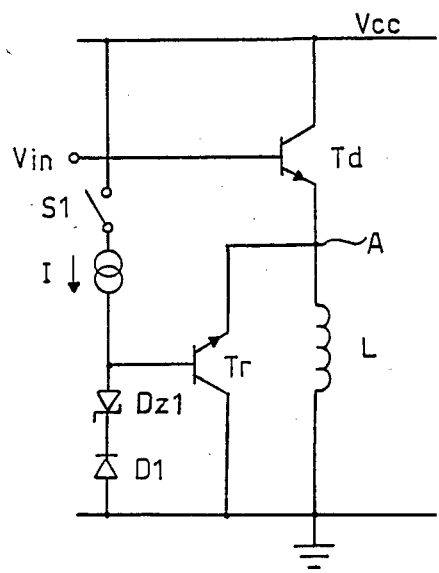
FIG. 2 shows a circuit for the recirculation of the discharge current of an inductive load which may be optionally set for a slow recirculation or for a fast recirculation in accordance with the present invention.

As shown in FIG. 2, the recirculation circuit of the invention employs a single power device for current recirculation represented by an NPN transistor Tr. The emitter of the transistor is connected to the drive terminal of the load L and the collector is grounded. The driving power transistor Td may be an NPN transistor as shown or a PNP transistor and it is driven through the base by a driving signal Vin coming from a generic control circuit which is not shown in the figure.

During the driving of the load, when a slow recirculation of the discharge current is desired, the recirculation NPN transistor Tr is maintained in a saturation condition by means of a current source capable of delivering to the base of the transistor Tr a current sufficient to drive the transistor to saturation. In FIG. 2, such a condition is realized by means of a current generator I controlled by a switch S1. The S1 switch remains normally closed during a slow recirculation phase (when the load is being driven).

When a fast recirculation of the discharge current of the inductance L is desired, e.g. for stopping the relative electric motor, besides interrupting of the driving signal Vin, the switch S1 is opened thus cutting off the delivery of the saturation current I to the base of the recirculation transistor Tr.

In this conditon the base current of the recirculation transistor Tr is only that necessary to sustain the recirculation current through the transistor itself, which no longer being saturated will assume a forward voltage given by the sum of the base-emitter voltage, the voltage drop across the diode D1 and the voltage of the zener diode Dz, i.e. the voltage between node A and ground becomes relatively high in order to permit a fast recirculation of the discharge current of the inductance.

Viceversa during a driving phase of the load under slow recirculation condition of the discharge current, the voltage at which recirculation of the discharge current of the inductance L occurs is equal to the saturation voltage across the recirculation transistor Tr, i.e. recirculation occurs at a relatively very small voltage.

Of course the means for delivering a saturation current to the base of the recirculation transistor during the driving phase of the load may be of various kinds, as it will be obvious to the skilled technician, moreover the signal for closing the switch S1 may conveniently be provided by the same control circuit which generates the driving signal Vin fed to the base of the driving transistor Td.

What we claim is:

1. A circuit for recirculating discharge current of an inductive load driven from a supply rail of an electrical supply by means of a switthing power transistor functionally connected between said supply rail and a first terminal of said inductive load, the other terminal of which is grounded, and having a base to which a driving signal generated by a control circuit is fed, capable of permitting recirculation of said discharge current under two different recirculation voltages which is selected for implementing a slow recirculation or a fast recirculation of said discharge current and characterized by comprising

- a recirculation NPN transistor having an emitter connected to said first terminal of the inductive load, a collector connected to ground and a base connected to the anode of a zener diode, the cathode of which is connected to the cathode of a second diode, the anode of which is connected to said ground;
- a current source capable of delivering to the base of said NPN recirculation transistor a current sufficient to drive the latter to saturation for implementing a slow recirculation of the discharge current of the inductive load through the recirculation NPN transistor itself at a recirculation voltage which is substantially equal to the saturation voltage of the recirculation transistor; and
- means for interrupting delivery to the base of the recirculation NPN transistor of said saturating current for implementing a fast recirculation of the discharge current of the inductive load through the NPN recirculation transistor itself at a recirculation voltage which is substantially equal to the sum of the voltage drop across said second diode, the voltage of said zener diode and the baseemitter voltage of said recirculation NPN transistor.

2. The circuit of claim 1, wherein said means for interrupting comprise an analog switch formed by a transistor driven through the base thereof by a second signal generated by said control circuit.

* * * * *